US006476849B1

(12) United States Patent
Kerr et al.

(10) Patent No.: US 6,476,849 B1
(45) Date of Patent: Nov. 5, 2002

(54) IMAGE PROCESSING APPARATUS WITH INTERNAL SCANNER

(75) Inventors: Roger S. Kerr, Brockport, NY (US); John D. Gentzke, Rochester, NY (US); William L. DeMarco, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/946,020

(22) Filed: Sep. 4, 2001

(51) Int. Cl.[7] .................................................. B41J 2/435
(52) U.S. Cl. ..................... 347/262; 346/134; 346/139 D
(58) Field of Search ................................. 347/262, 264, 347/108; 399/144, 151; 346/134, 138, 139 D; 400/545, 568, 659; 101/93.37

(56) References Cited

U.S. PATENT DOCUMENTS

| | | | |
|---|---|---|---|
| 5,053,791 A | 10/1991 | Baek et al. | |
| 5,175,564 A | 12/1992 | Jamzadeh | |
| 5,214,444 A | 5/1993 | Kerr et al. | |
| 5,260,714 A | 11/1993 | DeCook et al. | |
| 5,268,708 A | 12/1993 | Harshbarger et al. | |
| 5,270,731 A | 12/1993 | Kerr et al. | |
| 5,276,464 A | 1/1994 | Kerr et al. | |
| 5,301,099 A | 4/1994 | Kerr | |
| 5,323,180 A | 6/1994 | Kerr | |
| 5,341,159 A | 8/1994 | Kerr | |
| 5,376,954 A | 12/1994 | Kerr | |
| 5,446,477 A | 8/1995 | Baek et al. | |
| 5,650,863 A | * 7/1997 | Utagawa et al. | ............ 358/475 |
| 5,777,658 A | 7/1998 | Kerr et al. | |
| 6,002,419 A | 12/1999 | Kerr et al. | |
| 6,014,162 A | * 1/2000 | Kerr et al. | ................... 347/262 |
| 6,037,960 A | 3/2000 | Kerr et al. | |
| 6,133,936 A | * 10/2000 | Blake et al. | ................ 347/262 |

* cited by examiner

Primary Examiner—John Barlow
Assistant Examiner—Ly T Tran
(74) Attorney, Agent, or Firm—The Harleston Law Firm

(57) ABSTRACT

An image processing apparatus (10) for scanning and proofing an image at the same time includes:

a) a rotatable drum (300) having a hollowed out interior port ion (304), and an imaging portion (461) on its exterior surface, and a scanning portion (462) on its interior surface, the drum (300) being mounted for rotation about an axis, the imaging portion (461) of the drum being arranged to mount a receiver sheet (32) and a donor sheet (36) in superposed relationship, the scanning portion of the drum being arranged to mount an input image (456) thereon;

b) a motor (258) for rotating the drum (300);

c) a printhead (500) external to the drum;

d) an input scanner (455) inside the hollowed out interior portion (304) of the drum;

e) a first lead screw (250) for moving the printhead (500) in a first direction, the printhead being mounted on the first lead screw (250), and a second lead screw (465) for moving the scanner (455) in a first direction, the scanner being mounted on the second lead screw (465); and f) a linear translation subsystem (210) or subsystems on which the printhead (500), scanner (455), drum (300), and lead screws (250, 465) are mounted. Alternatively, the printhead is inside the drum, and the scanner is external to the drum.

21 Claims, 10 Drawing Sheets

IMAGE PROCESSING APPARATUS WITH INTERNAL SCANNER

CROSS REFERENCE TO RELATED APPLICATIONS

Reference is made to commonly-assigned copending U.S. patent application Ser. No. 09/945,922, filed Sep. 4, 2001, entitled IMAGE PROCESSING APPARATUS AND METHOD FOR SIMULTANEOUSLY SCANNING AND PROOFING, by Roger S. Kerr et al., the disclosure of which is incorporated herein.

FIELD OF THE INVENTION

The invention relates to a color image processing apparatus and method for simultaneously scanning and proofing an image, in general, and in particular to a color image processing apparatus incorporating an input scanner and a printer, where the scanning head is internal to the drum and the printhead is external to the drum, or vice versa.

BACKGROUND OF THE INVENTION

Pre-press color-proofing is a procedure that is used by the printing industry for creating representative images of printed material without the high cost and time that is required to actually produce printing plates and set up a high-speed, high volume, printing press to produce an example of an intended image. These may require several corrections and be reproduced several times to satisfy or meet the customers requirements resulting in a large loss of profits and ultimately higher costs to the customer.

One such commercially available image processing apparatus has half-tone color proofing capabilities and is arranged to form an intended image on a sheet of thermal print media. Dye is transferred from a sheet of dye donor material to the thermal print media by applying a sufficient amount of thermal energy to the dye donor sheet material to form the intended image. This image processing apparatus generally includes a material supply assembly or carousel and a lathe bed scanning subsystem or write engine. The write engine includes a lathe bed scanning frame, translation drive, translation stage member, printhead, and imaging drum and thermal print media and dye donor sheet material exit transports.

Although conventional input scanners and image processing apparatus work satisfactorily, they are not without drawbacks. The number of input scans and intended images printed per hour of a conventional image processing apparatus is, in part, limited by having to scan the image and store it as a digital data file and then ripping the digital data file so it can be printed on the image processing apparatus. Generally, the faster the intended image can be scanned and exposed onto the thermal print media, the greater the throughput of the pre-press process.

In conventional input scanning and image processing apparatus, the image must be scanned, stored on some type of data storage medium, and ripped, then printed, before the scanned image file can be viewed as a half tone image to determine whether any defect occurred during the scanning process. Unfortunately, any defects in the scanning of the image are not seen until the image is ripped and printed, or worse, used in a page layout on a CEPS or PS (Post Script) workstation prior to any printing. This is aggravating and results in a loss of time spent on storing and ripping the image, working with the image on the CEPS or PS workstation, and scanning and printing (versus printing while scanning).

The image processing apparatus of the present invention, which receives thermal print media and dye donor materials for processing an intended image onto the thermal print media, includes an input scanner for digitally scanning an image. The intended image is attached to an input scanner portion of the drum, and thermal print media and dye donor material are loaded on the imaging portion of the drum Once the imaging drum spins up to speed, the translation system, which is timed to the drum, begins to translate the input scanning head and the printhead across the drum As data from the input scanner is ripped and fed to the printhead, energy from the printhead creates the intended image on the thermal print media. The input scanner is incorporated into the image processing apparatus of the present invention so that the scanned image file can be viewed early on to determine whether any defects have occurred. The defects can then be remedied in an earlier stage of the process.

Advantages of the present invention include the following:

1) the image processing apparatus prints the image as it is being scanned;
2) dramatically increase throughput of the pre-press process;
3) printing of the image can be initiated without having to store the entire image as a digital data file;
4) the same drum, translator drive, and associated electronics are used to scan and print, which is less expensive than two sets;
5) the same machine electronics and controls electronics are used to scan and print;
6) the scanned data file is printed as a halftone image prior to working with the image on a CEPS or PS workstation, which saves time and expense; and
7) one piece of equipment is used to scan and print the image instead of two pieces of equipment. This single apparatus uses less floor space and is more convenient and generally less expensive and easier to troubleshoot than two pieces.

Where the scanner is inside the rotatable drum, two working environments are surprisingly created in the same space where one existed before. In addition to the benefits of being able to scan and proof at the same time, the apparatus is more compact since the inside of the drum is also being utilized. Floor space is saved, and the apparatus gives the appearance of being, and is, technically advanced.

SUMMARY OF THE INVENTION

The present invention is an image processing apparatus for scanning and proofing an image at the same time, including:

a) a rotatable drum comprising an imaging portion on its exterior surface, and a scanning portion on its interior surface, the imaging portion of the drum being arranged to mount a receiver sheet and a donor sheet in superposed relationship thereon, the scanning portion of the drum being arranged to mount an input image thereon, the drum being mounted for rotation about an axis, and the drum further comprising a hollowed-out interior portion;

b) a motor for rotating the drum;

c) a printhead external to the drum;

d) an input scanner inside the hollowed-out interior portion of the drum;

e) a first lead screw for moving the printhead in a first direction, the printhead being mounted on the first lead screw, and a second lead screw for moving the scanner in a first direction, the scanner being mounted on the second lead screw; and f) a linear translation subsystem on which the printhead, scanner, drum, and lead screws are mounted. Also included herein is the reverse, where the printhead is inside the drum and the scanner is outside the drum

BRIEF DESCRIPTION OF THE DRAWINGS

A more complete understanding of the invention and its advantages will be apparent from the detailed description taken in conjunction with the accompanying drawings, wherein examples of the invention are shown, and wherein.

DETAILED DESCRIPTION OF THE INVENTION

Figure 1:
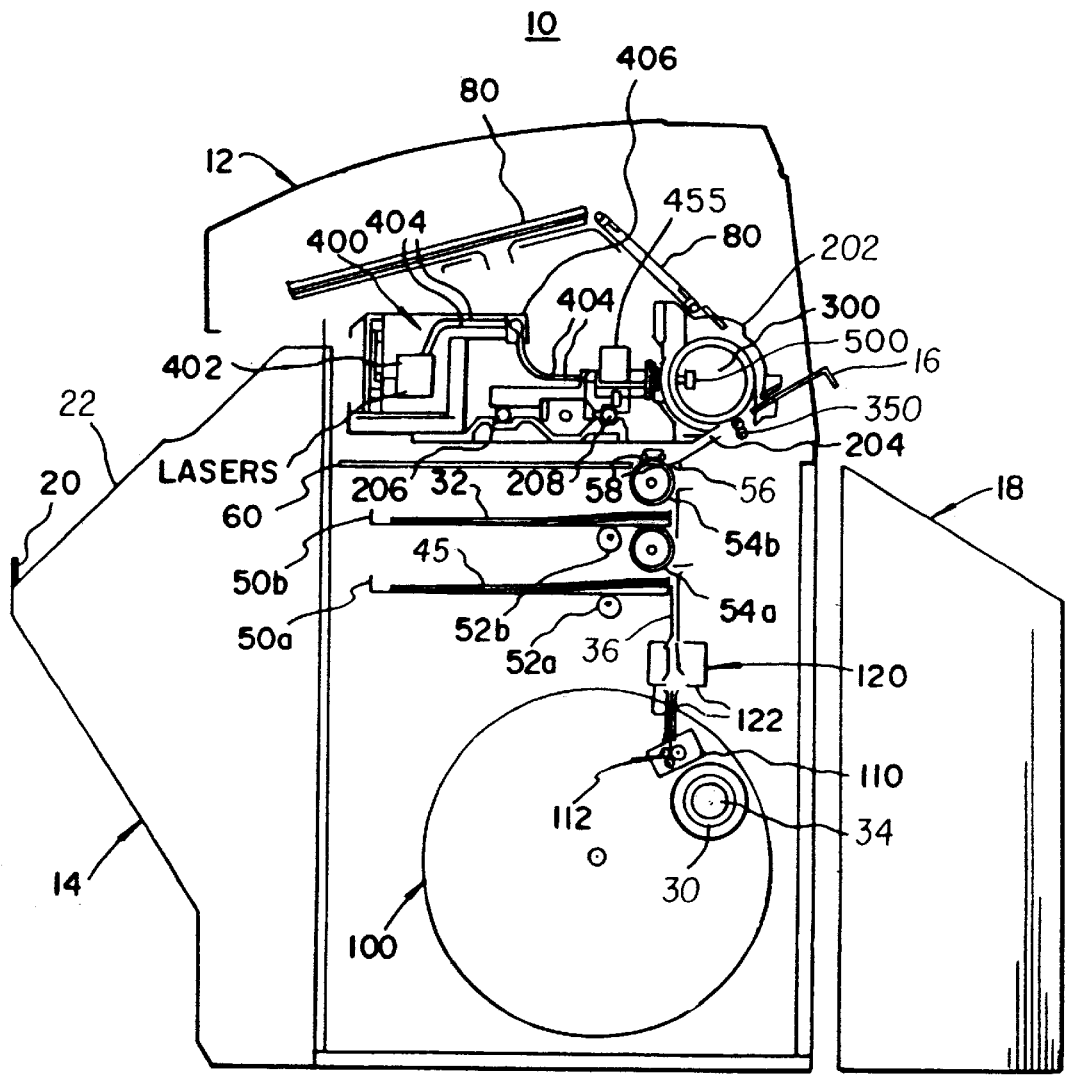
FIG. 1 is a side view in vertical cross-section of an image processing apparatus according to the present invention.

In the following description, like reference characters designate like or corresponding parts throughout the several views. Also, in the following description, it is to be understood that such terms as "front," "rear," "lower," "upper," and the like are words of convenience and are not to be construed as limiting terms. Referring in more detail to the drawings, the invention will now be described.

Turning first to FIG. 1, an image processing apparatus according to the present invention, which is generally referred to as 10, includes an image processor housing 12, which provides a protective cover for the apparatus. The apparatus 10 also includes a hinged image processor door 14, which is attached to the front portion of the image processor housing 12 and permits access to the two sheet material trays. A lower sheet thermal print material tray 50a and upper sheet input image material tray 50b are positioned in the interior portion of the image processor housing 12 for supporting thermal print media 32, or an input image, thereon. Only one of the sheet material trays 50 will dispense the thermal print media 32 out of the sheet material tray 50 to create an intended image thereon. The alternate sheet material tray either holds an alternative type of thermal print media 32, or an input image, or functions as a back up sheet material tray. In this regard, lower sheet material tray 50a includes a lower media lift cam 52a, which is used to lift the lower sheet material tray 50a and, ultimately, the thermal print media 32 upwardly toward lower media roller 54a and upper media roller 54b. When the media rollers 54a, b are both rotated, the thermal print media 32 is pulled upwardly towards a media guide 56. The upper sheet input image material tray 50b includes an upper media lift cam 52b for lifting the upper sheet thermal print material tray 50b and, ultimately, the thermal print media 32 towards the upper media roller 54b, which directs it toward the media guide 56.

Continuing with FIG. 1, the movable media guide 56 directs the thermal print media 32 under a pair of media guide rollers 58. This engages the thermal print media 32 for assisting the upper media roller 54b in directing it onto the media staging tray 60. The media guide 56 is attached and hinged to the lathe bed scanning frame 202 at one end, and is uninhibited at its other end for permitting multiple positioning of the media guide 56. The media guide 56 then rotates the uninhibited end downwardly, as illustrated. The direction of rotation of the upper media roller 54b is reversed for moving the thermal print medium receiver sheet material 32, which is resting on the media staging tray 60, under the pair of media guide rollers 58 upwardly through an entrance passageway 204 and up to the imaging drum 300.

A roll 30 of dye donor material 34 is connected to the media carousel 100 in a lower portion of the image processor housing 12, as shown in FIG. 1. Four rolls 30 are ordinarily used, but, for clarity, only one is shown in FIG. 1. Each roll 30 includes a dye donor material 34 of a different color, typically black, yellow, magenta and cyan. These dye donor materials 34 are ultimately cut into dye donor sheet materials 36 and passed to the imaging drum 300 for forming the medium from which dyes embedded therein are passed to the thermal print media 32 resting thereon. In this regard, a media drive mechanism 110 is attached to each roll 30 of dye donor material 34, and includes three media drive rollers 112 through which the dye donor material 34 of interest is metered upwardly into a media knife assembly 120. After the dye donor material 34 reaches a predetermined position, the media drive rollers 112 cease driving the dye donor material 34. Two media knife blades 122 positioned at the bottom portion of the media knife assembly 120 cut the dye donor material 34 into dye donor sheet materials 36. The lower media roller 54a and the upper media roller 54b along with the media guide 56 then pass the dye donor sheet material 36 onto the media staging tray 60 and ultimately to the imaging drum 300.

FIG. 1 shows an imaging drum 300 and a load roller 350. Once the thermal print medium receiver sheet material 32 is moved into position, the load roller 350 is moved into contact with the thermal print medium receiver sheet material 32 against the imaging drum 300. Once the thermal print medium receiver sheet material 32 is in place, the dye donor sheet material 36 is positioned on the imaging drum 300 in registration with the thermal print media 32. Using the same process as described herein for loading the thermal print media 32 to the imaging drum 300, the dye donor sheet material 36 rests atop the thermal print media 32, with a narrow gap between the two created by micro-beads embedded in the surface of the thermal print media 32.

As shown in FIG. 1, a laser assembly 400 includes a quantity of laser diodes 402 in its interior. The lasers are connected via fiber optic cables 404 to a distribution block 406 and ultimately to a printhead 500. The printhead 500 directs thermal energy received from the laser diodes 402. This causes the dye donor sheet material 36 to pass the desired color across the gap to the thermal print media 32. The printhead 500 attaches to a lead screw 250 (see FIG. 2). A lead screw drive nut 254 and drive coupling (not shown) permit axial movement along the longitudinal axis of the imaging drum 300 for transferring the data to create the intended image onto the thermal print media 32.

For writing, the imaging drum 300 rotates at a constant velocity. The printhead 500 begins at one end of the thermal print media 32 and traverses the entire length of the thermal print media 32 for completing the transfer process for the particular dye donor sheet material 36 resting on the thermal print media 32. After the printhead 500 completes the transfer process for the particular dye donor sheet material 36 resting on the thermal print media 32, the dye donor sheet material 36 is removed from the imaging drum 300 and transferred out of the image processor housing 12 via a skive or ejection chute 16. The dye donor sheet material 36 eventually comes to rest in a waste bin 18 for removal by the user. The above-described process is then repeated for the other three rolls 30 of dye donor materials 34.

Continuing with FIG. 1, after the color from all four sheets of the dye donor sheet materials 36 has been transferred, the dye donor sheet material 36 is removed from the imaging drum 300. The thermal print media 32 with the intended image thereon is then removed from the imaging drum 300 and transported via a transport mechanism 80 out of the image processor housing 12 and comes to rest against a media stop 20.

Operation of the image processing apparatus 10 includes metering a length of the thermal print media (in roll form) from the material assembly or carousel. The thermal print media 32 is then measured and cut into sheet form of the required length and transported to the imaging drum 300. It is then registered, wrapped around, and secured onto the drum 300. Next, a length of dye donor material (in roll form) 34 is metered out of the material supply assembly or carousel, measured, and cut into sheet form of the required length. It is then transported to the imaging drum 300 and wrapped around the imaging drum using the load roller 350, so that it is superposed in the desired registration with respect to the thermal print media, which has already been secured to the imaging drum.

After the dye donor sheet material 36 is secured to the periphery of the imaging drum 300, the scanning subsystem 200 or write engine provides the scanning function. This is accomplished by retaining the thermal print media 32 and the dye donor sheet material 36 on the spinning imaging drum 300 while it is rotated past the printhead 500 that will expose the thermal print media 32. The translator drive 258 then traverses the printhead 500 and translation stage member 220 axially along the axis of the imaging drum in coordinated motion with the rotating imaging drum 300. These movements combine to produce the intended image on the thermal print media 32. "The scanner 455 is located external to the drum 300."

After the intended image has been written on the thermal print media 32, the dye donor sheet material 36 is removed from the imaging drum without disturbing the thermal print media beneath it. The dye donor sheet material 36 is then transported out of the image processing apparatus 10 by a material exit transport. Additional dye donor sheet materials 36 are sequentially superimposed with the thermal print media 32 on the imaging drum. Then they are imaged onto the thermal print media until the intended image is complete. The completed image on the thermal print media is then unloaded from the imaging drum and transported to an external holding tray on the image processing apparatus by the receiver sheet material exit transport.

The sheet material exit transports are a sheet material waste exit and an imaged sheet material exit. The dye donor sheet material exit transport includes a waste dye donor sheet material stripper blade, which is disposed adjacent to the upper surface of the imaging drum. In the unload position, the stripper blade contacts the waste dye donor sheet material on the imaging drum surface. When not in operation, the stripper blade is moved up and away from the surface of the imaging drum. A driven waste dye donor sheet material transport belt is arranged horizontally to carry the waste dye donor sheet material, which is removed by the stripper blade from the surface of the imaging drum to an exit formed in the exterior of the image processing apparatus. A waste bin for waste: dye donor sheet materials is separate from the image processing apparatus.

Continuing with a description of the operation of the apparatus, the media carousel 100 is rotated about its axis into the desired position, so that the thermal print media 32 or dye donor material (in roll form) 34 can be withdrawn, measured, and cut into sheet form of the required length, and then transported to the imaging drum To accomplish this, the media carousel 100 has a vertical circular plate, preferably with, though not limited to, six material support spindles. The support spindles are arranged to carry one roll of thermal print media, and four rolls of dye donor material. They provide the four primary colors, which are preferably used in the writing process to form the intended image. One roll is used as a spare or for a specialty color dye donor material, if so desired. Each spindle has a feeder assembly to withdraw the thermal print media or dye donor material from the spindles.

Figure 2:
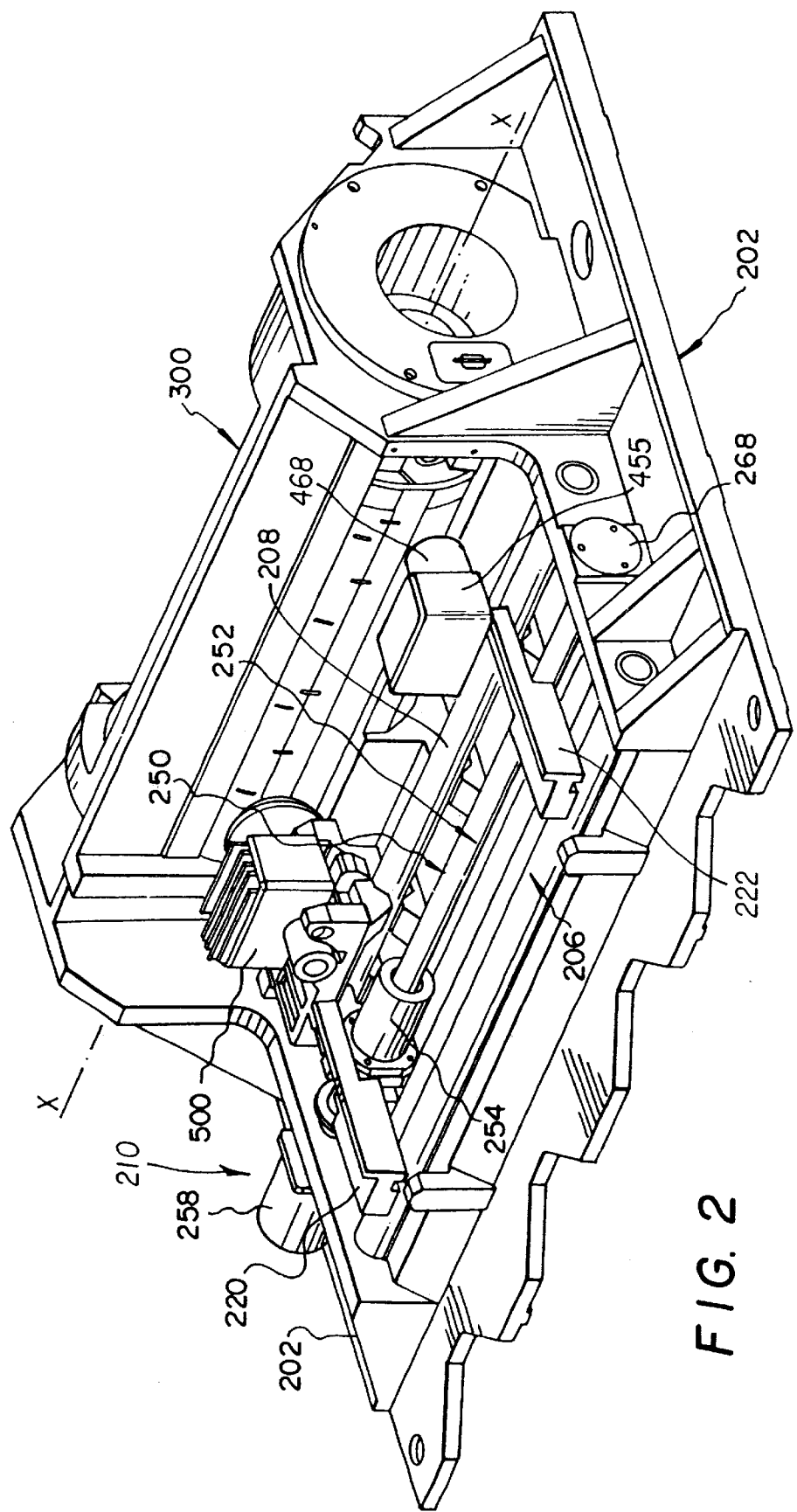
FIG. 2 is a perspective view of an image processing apparatus according to the present invention.

Turning to FIG. 2, the image processing apparatus 10 includes the imaging drum 300, scanner 455, printhead 500, and lead screw 250, which are assembled in the lathe bed scanning frame 202. The imaging drum 300 is mounted for rotation about an axis X in the lathe bed scanning frame 202. The printhead 500 is movable with respect to the imaging drum 300, and is arranged to direct a beam of light to the dye donor sheet material 36. The beam of light from the printhead 500 for each laser diode 402 (shown in FIG. 1) is modulated individually by modulated electronic signals from the image processing apparatus 10. These are representative of the shape and color of the original image. The color on the dye donor sheet material 36 is heated to cause volatilization only in those areas in which its presence is required on the thermal print media 32 to reconstruct the shape and color of the original image.

Continuing with FIG. 2, the printhead 500 is mounted on a movable translation stage member 220, which is supported for low friction movement on translation bearing rods 206, 208. The translation system 210 includes the translation stage member 220, the translation bearing rods 206, 208, and the translator drive 258. The translation bearing rods 206, 208 are sufficiently rigid so as not sag or distort between mounting points and are arranged as parallel as possible with the axis X of the imaging drum 300, with the axis of the printhead 500 perpendicular to the axis X of the imaging drum 300 axis. The front translation bearing rod 208 locates the translation stage member 220 in the vertical and the horizontal directions with respect to axis X of the imaging drum 300. The rear translation bearing rod 206 locates the translation stage member 220 only with respect to rotation of the translation stage member 220 about the front translation bearing rod 208. This is done so that there is no over-constraint of the translation stage member 220, which might cause it to bind, chatter, or otherwise impart undesirable vibration or jitters to the printhead 500 during the generation of an intended image. The translator drive 258 traverses the translation stage member and printhead axially along the imaging drum.

Figure 3:
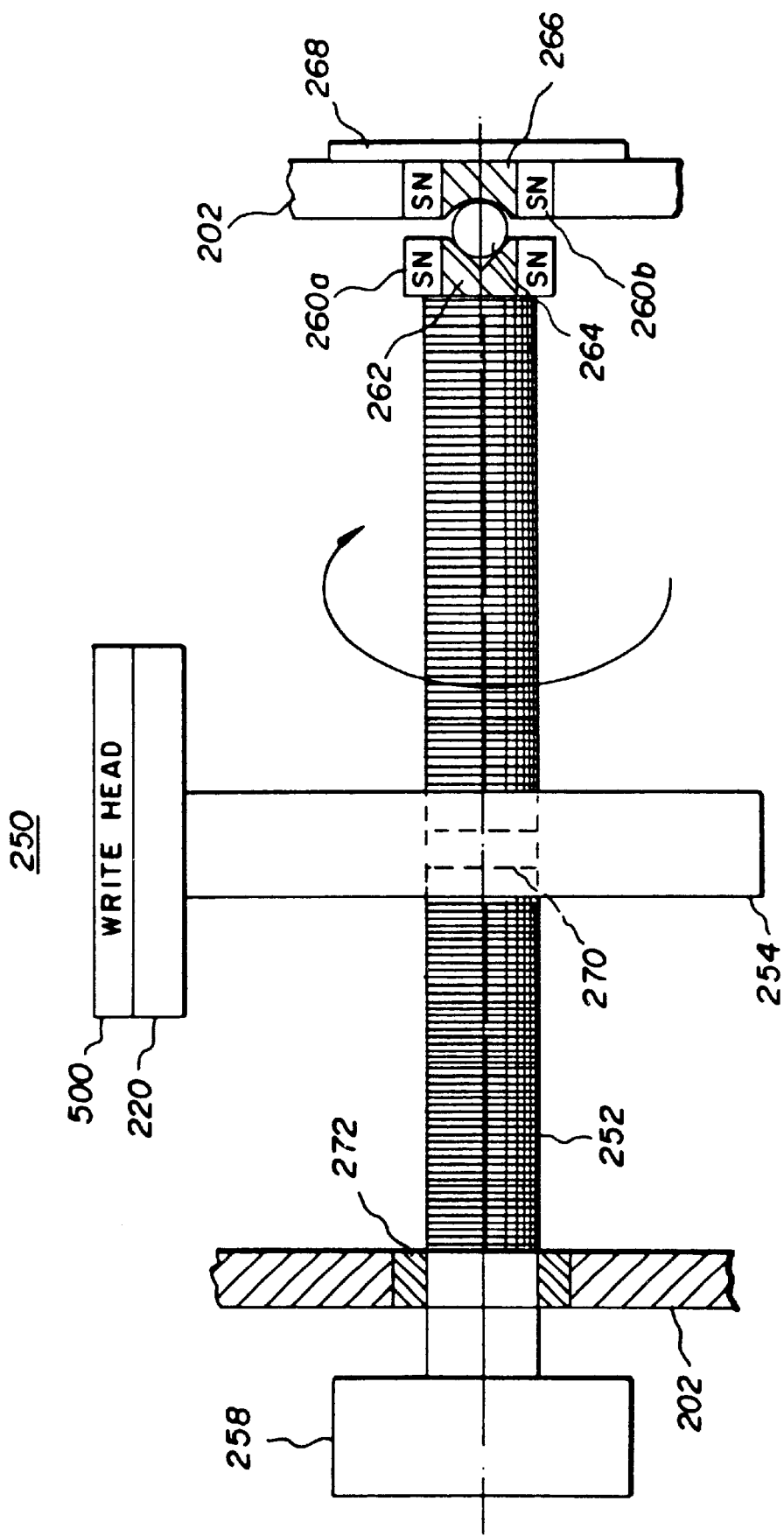
FIG. 3 is a top view in horizontal cross section, partially in phantom, of a lead screw according to the present invention.

Referring to FIGS. 2 and 3, the lead screw 250 includes an elongated, threaded shaft 252, which is attached to the translator linear drive motor 258 on its drive end and to the lathe bed scanning frame 202 by means of a radial bearing 272. A lead screw drive nut 254 includes grooves in its hollowed-out center portion 270 for mating with the threads of the threaded shaft 252. This allows the lead screw drive nut 254 axial movement along the threaded shaft 252 as the threaded shaft 252 is rotated by the linear drive motor 258. The lead screw drive nut 254 is integrally attached to the to the printhead 500 through the lead screw coupling (not shown) and the translation stage member 220 at its periphery, so that the threaded shaft 252 is rotated by the linear drive motor 258. This moves the lead screw drive nut 254 axially along the threaded shaft 252, which in turn moves the translation stage member 220, and ultimately the printhead 500 axially along the imaging drum 300.

As best illustrated in FIG. 3, an annular-shaped axial load magnet 260a is integrally attached to the driven end of the threaded shaft 252, and is in a spaced-apart relationship with another annular-shaped axial load magnet 260b attached to the lathe bed scanning frame 202. The axial load magnets 260a and 260b are preferably made of rare-earth materials such as neodymium-iron-boron.

A generally circular-shaped boss 262 part of the threaded shaft 252 rests in the hollowed-out portion of the annular-shaped axial load magnet 260a, and includes a generally V-shaped surface at the end for receiving a ball bearing 264. A circular-shaped insert 266 is placed in the hollowed-out portion of the other annular-shaped axial load magnet 260b. It has an arcuate-shaped surface at one end for receiving ball bearing 264, and a flat surface at its other end for receiving an end cap 268 placed over the annular-shaped axial load magnet 260b, which is attached to the lathe bed-scanning frame 202 for protectively covering the annular-shaped axial load magnet 260b. This provides an axial stop for the lead screw 250.

Continuing with FIG. 3, the linear drive motor 258 is energized and imparts rotation to the lead screw 250, as indicated by the arrows. This causes the lead screw drive nut 254 to move axially along the threaded shaft 252. The annular-shaped axial load magnets 260a, 260b are magnetically attracted to each other, which prevents axial movement of the lead screw 250. The ball bearing 264, however, permits rotation of the lead screw 250 while maintaining the positional relationship of the annular-shaped axial load magnets 260, i.e., slightly spaced apart. Mechanical friction between them is thus prevented, yet the threaded shaft 252 can continue to rotate.

The printhead 500 travels in a path along the imaging drum 300, moving at a speed synchronous with the imaging drum 300 rotation and proportional to the width of the writing swath. The pattern transferred by the printhead 500 to the thermal print media 32 along the imaging drum 300 is a helix.

In operation, the scanning subsystem 200 or write engine contains the mechanisms that provide the mechanical actuations for the imaging drum positioning and motion control to facilitate placement of loading onto, and removal of the thermal print media 32 and the dye donor sheet material 36 from the imaging drum 300. The scanning subsystem 200 or write engine provides the scanning function by retaining the thermal print media 32 and dye donor sheet material 36 on the rotating imaging drum 300. This generates a once per revolution timing signal to the data path electronics as a clock signal, while the translator drive 258 traverses the translation stage member 220 and printhead 500 axially along the imaging drum 300 in a coordinated motion with the imaging drum rotating past the printhead. Positional accuracy is maintained in order to control the placement of each pixel, so that the intended image produced on the thermal print media is precise.

During operation, the lathe bed scanning frame 202 supports the imaging drum and its rotational drive. The translation stage member 220 and write head are supported by the two translation bearing rods 206,208 that are positioned parallel to the imaging drum and lead screw. They are parallel to each other and form a plane therein, along with the imaging drum and lead screw. The translation bearing rods are, in turn, supported by the outside walls of the lathe bed scanning frame of the lathe bed scanning subsystem or write engine. The translation bearing rods are positioned and aligned therebetween.

The translation drive 258 is for permitting relative movement of the printhead 500 by means of a DC servomotor and encoder, which rotates the lead screw 250 parallel with the axis of the imaging drum 300. The printhead 500 is placed on the translation stage member 220 in the "V" shaped grooves. The "V" shaped grooves are in precise relationship to the bearings for the front translation stage member 220 supported by the front and rear translation bearing rods 206, 208. The translation bearing rods are positioned parallel to the imaging drum 300. The printhead is selectively locatable with respect to the translation stage member, thus it is positioned with respect to the imaging drum surface. The printhead has a means of adjusting the distance between the printhead and the imaging drum surface, and the angular position of the printhead about its axis using adjustment screws. An extension spring provides a load against these two adjustment means. The translation stage member 220 and printhead 500 are attached to the rotational lead screw 250, which has a threaded shaft, by a drive nut and coupling. The coupling is arranged to accommodate misalignment of the drive nut and lead screw so that only forces parallel to the linear lead screw and rotational forces are imparted to the translation stage member by the lead screw and drive nut. The lead screw rests between two sides of the lathe bed scanning frame 202 of the lathe bed scanning subsystem 200 or write engine, where it is supported by deep groove radial bearings. At the drive end, the lead screw 250 continues through the deep groove radial bearing through a pair of spring retainers. The spring retainers are separated and loaded by a compression spring, and to a DC servomotor and encoder. The DC servomotor induces rotation to the lead screw 250, which moves the translation stage member 220 and printhead 500 along the threaded shaft as the lead screw 250 is rotated. Lateral movement of the printhead 500 is controlled by switching the direction of rotation of the DC servomotor and thus the lead screw 250.

The printhead 500 includes a number of laser diodes 402, which are tied to the printhead and can be individually modulated to supply energy to selected areas of the thermal print media 32 in accordance with an information signal. The printhead 500 of the image processing apparatus 10 includes a plurality of optical fibers, which are coupled to the laser diodes 402 at one end and at the opposite end to a fiber optic array within the printhead. The printhead 500 is movable relative to the longitudinal axis of the imaging drum 300. The dye is transferred to the thermal print media 32 as radiation is transferred from the laser diodes by the optical fibers to the printhead, and thus to the dye donor sheet material 36, and is converted to thermal energy in the dye donor sheet material.

Figure 4:
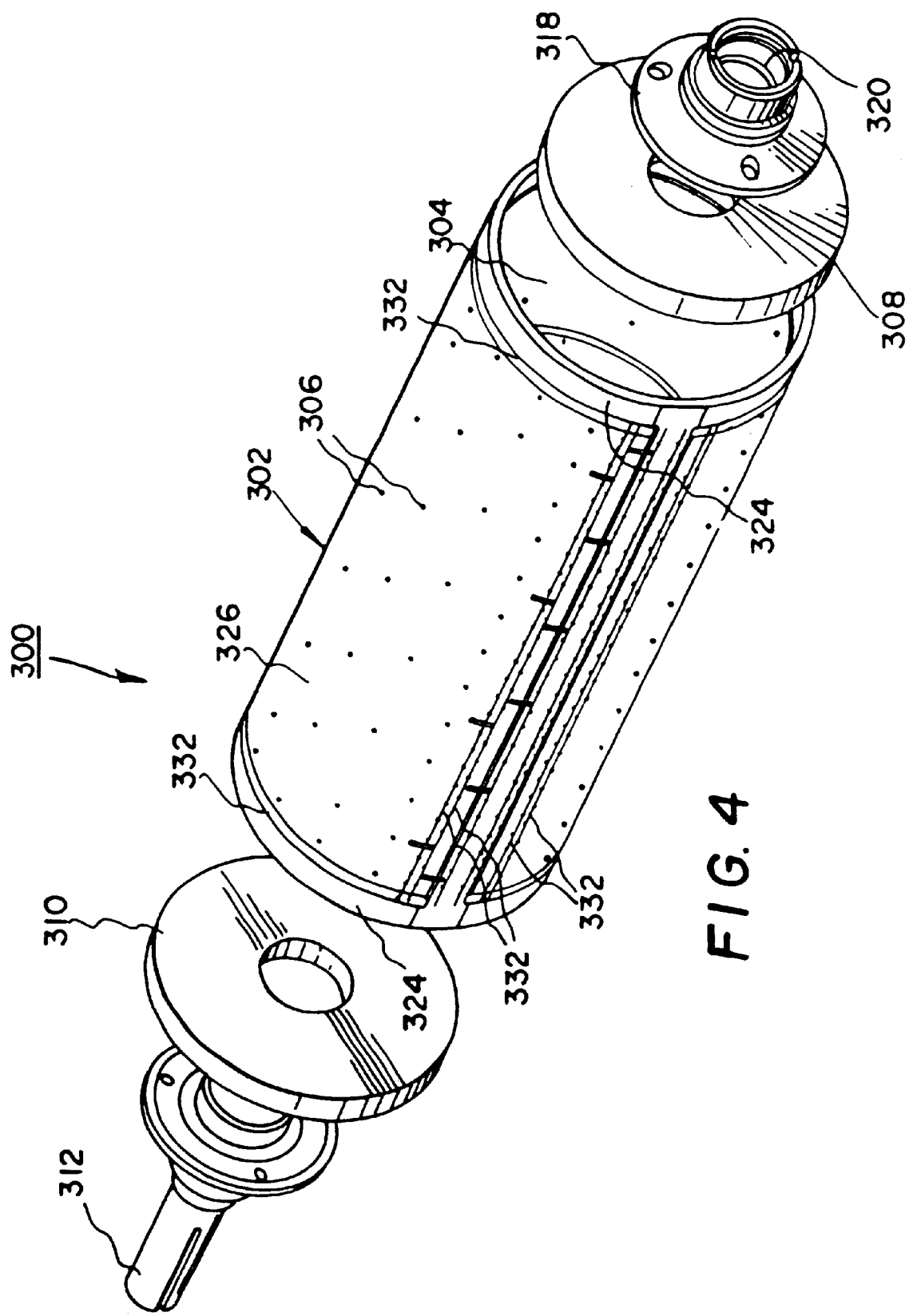
FIG. 4 is an exploded, perspective view of a vacuum imaging drum according to the present invention.

Referring to FIG. 4, the imaging drum 300 has a cylindrical-shaped vacuum drum housing 302. The drum is, by definition, hollow, and includes a hollowed-out interior portion 304. The imaging drum 300 further includes a number of vacuum grooves 332 and vacuum holes 306 extending through the vacuum drum housing 302. Vacuum is applied from the hollow interior portion 304 of the imaging drum 300 through these vacuum grooves and holes. The vacuum supports and maintains the position of the thermal print media 32 and the dye donor sheet material 36, even as the imaging drum 300 rotates.

Continuing with FIG. 4, the ends of the imaging drum 300 are closed by a vacuum end plate 308, and a drive end plate 310. The drive end plate 310 is provided with a centrally disposed drive spindle 312, which extends outwardly therefrom through a support bearing. The vacuum end plate 308 is provided with a centrally disposed vacuum spindle 318, which extends outwardly therefrom through another support bearing.

The drive spindle 312 extends through the support bearing and is stepped down to receive a DC drive motor armature (not shown), which is held on by a drive nut. A DC motor stator (not shown) is stationarily held by the late bed scanning frame member 202 (see FIGS. 1 and 2), encircling the DC drive motor armature to form a reversible, variable DC drive motor for the imaging drum 300. A drum encoder mounted at the end of the drive spindle 312 provides timing signals to the image processing apparatus 10.

As shown in FIG. 4, the vacuum spindle 318 is provided with a central vacuum opening 320. The central vacuum opening 320 is in alignment with a vacuum fitting with an external flange that is rigidly mounted to the lathe bed scanning frame 202 (see FIGS. 1 and 2). The vacuum fitting has an extension, which extends within but is closely spaced from the vacuum spindle 318, thus forming a small clearance. With this configuration, a slight vacuum leak is provided between the outer diameter of the vacuum fitting and the inner diameter of the central vacuum opening 320 of the vacuum spindle 318. This assures that no contact exists between the vacuum fitting and the imaging drum 300 that might impart uneven movement or jitters to the imaging drum 300 during its rotation.

The opposite end of the vacuum fitting is connected to a high-volume vacuum blower (not shown), which is capable of producing 50–60 inches of water at an air flow volume of 60–70 CFM. The vacuum blower provides vacuum to the imaging drum 300. The vacuum blower provides the various internal vacuum levels required during loading, scanning and unloading of the thermal print media 32 and the dye donor sheet materials 36 to create the intended image. With no media loaded on the imaging drum 300, the internal vacuum level of the imaging drum 300 is preferably approximately 10–15 inches of water. With just the thermal print media 32 loaded on the imaging drum 300, the internal vacuum level of the imaging drum 300 is preferably approximately 20–25 inches of water. This level is desired so that when a dye donor sheet material 36 is removed, the thermal print media 32 does not move and color to color registration is maintained. With both the thermal print media 32 and dye donor sheet material 36 completely loaded on the imaging drum 300, the internal vacuum level of the imaging drum 300 is approximately 50–60 inches of water in this embodiment.

In operation, vacuum is applied through the vacuum holes 306 extending through the drum housing 302. The vacuum supports and maintains the position of the thermal print media 32 and dye donor sheet material 36 as the imaging drum 300 rotates. The ends of the imaging drum are preferably enclosed by the cylindrical end plates, which are each provided with a centrally disposed spindle 318. The spindles extend outwardly through support bearings and are supported by the scanning frame. The drive end spindle extends through the support bearing and is stepped down to receive the motor armature, which is held on by a nut. The stator is held by the scanning frame, which encircles the armature to form the reversible, variable speed DC drive motor for the imaging drum An encoder mounted at the end of the spindle provides timing signals to the image processing apparatus. The central vacuum opening 320 on the opposite spindle 318 is in alignment with a vacuum fitting with an external flange that is rigidly mounted to the lathe bed scanning frame 202. The vacuum fitting has an extension extending within the vacuum spindle and forming a small clearance. A slight vacuum leak between the outer diameter of the vacuum fitting and the inner diameter of the opening of the vacuum spindle assures that no contact exists between the vacuum fitting and the imaging drum, which might impart uneven movement or jitters to the drum during its rotation.

Figure 5:
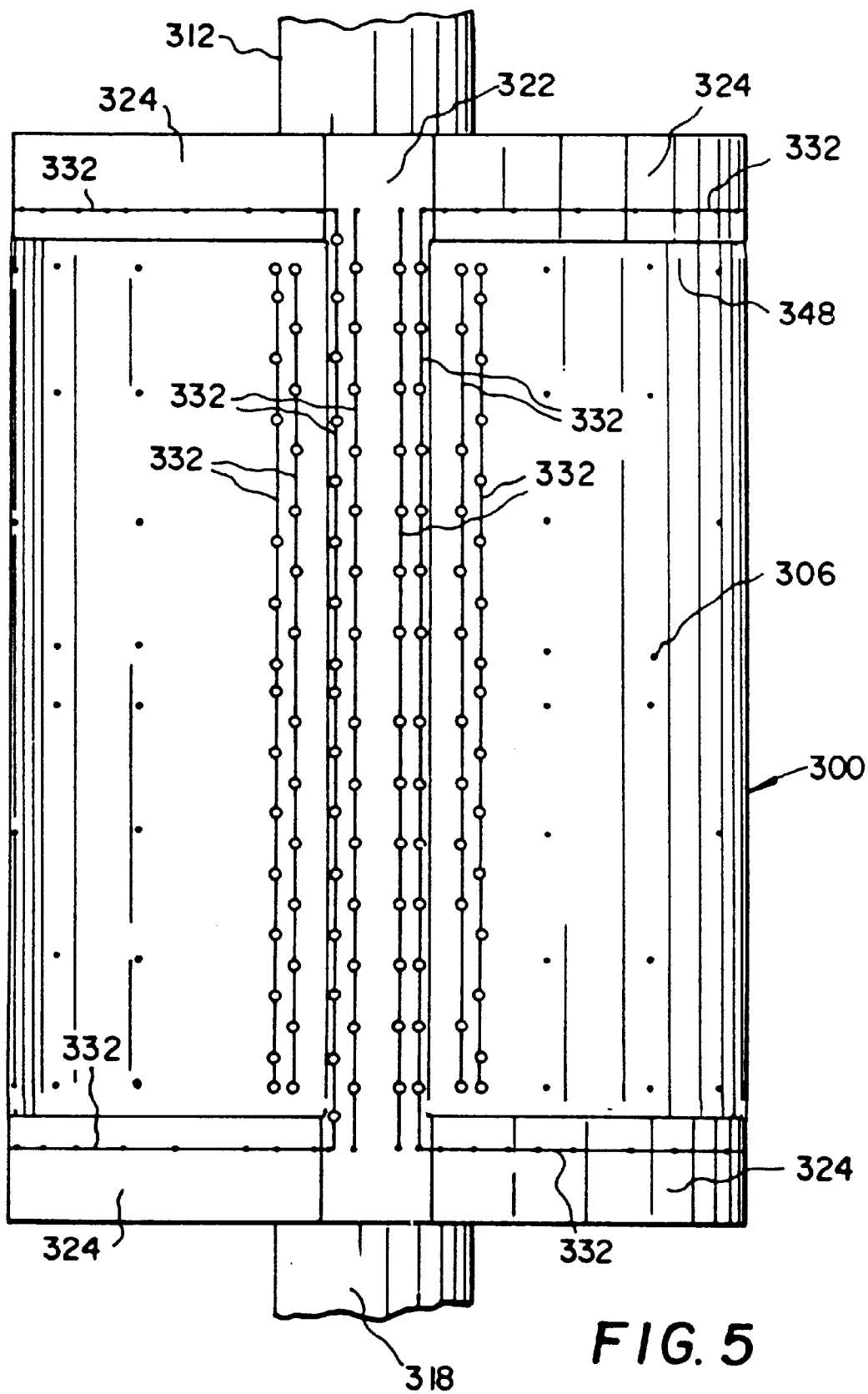
FIG. 5 is a plan view of a vacuum imaging drum surface according to the present invention.

Referring to FIG. 5, the outer surface of the drum 300 is provided with an axially extending flat 322, which preferably extends approximately 8 degrees of the drum 300 circumference. The drum 300 is provided with donor support rings 324, which form a radial recess 326 (see FIG. 4). This recess extends radially from one side of the axially extending flat 322 around the drum 300 to the other side of the axially extending flat 322, from approximately one inch from one end of the drum 300 to approximately one inch from the other end of the drum 300.

The imaging drum axially extending flat has two main purposes. First, it assures that the leading and trailing ends of the dye donor sheet material are somewhat protected from the effect of air during the relatively high speed rotation that the drum undergoes during the imaging process. Here, the air will have less tendency to lift the leading or trailing edges of the dye donor sheet material. The axially extending flat also ensures that the leading and trailing ends of the dye donor sheet material are recessed from the periphery of the imaging drum. This reduces the chance of the dye donor sheet material coming into contact with other parts of the image processing apparatus, such as the printhead. Such contact could cause a jam and possible loss of the intended image, or even catastrophic damage to the image processing apparatus.

Figure 6A:
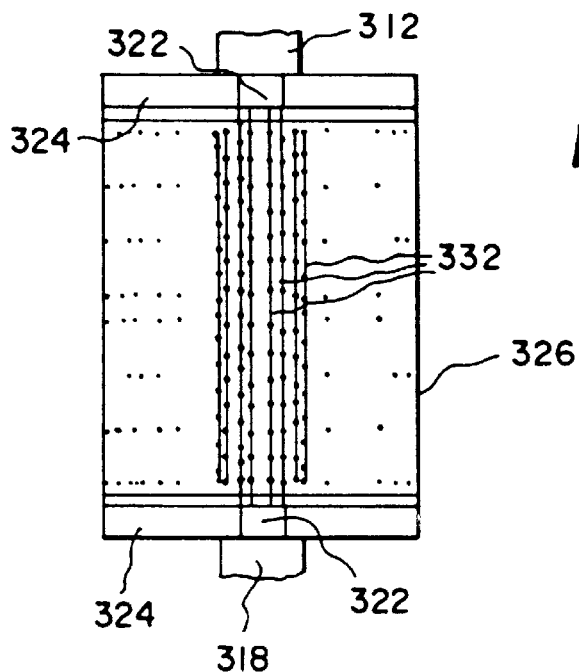
FIGS. 6A–6C are plan views of a vacuum imaging drum according to the present invention, showing a sequence of placement for thermal print media and dye donor sheet material.
Figure 6B:
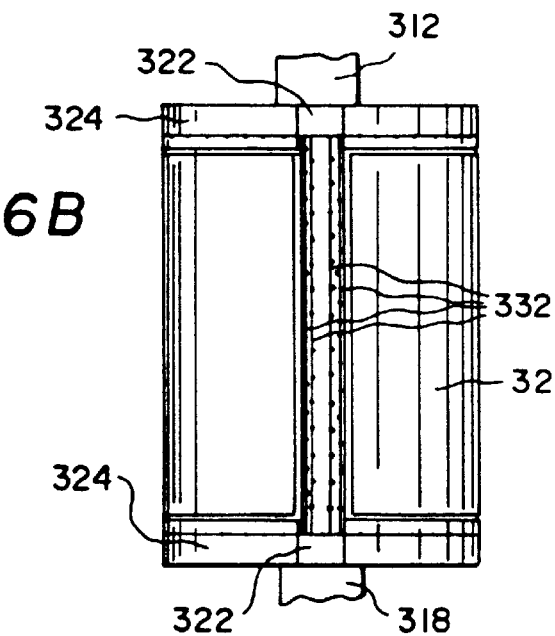
Figure 6C:
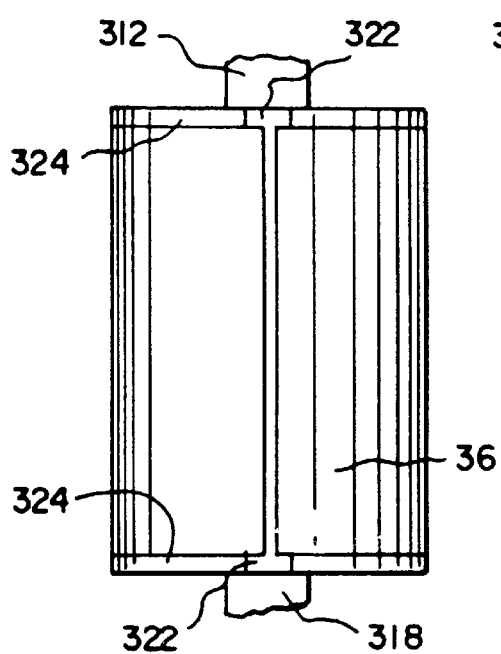

The imaging drum axially extending flat also acts to impart a bending force to the ends of the dye donor sheet materials as they are held onto the imaging drum surface by vacuum from within the interior of the imaging drum. When the vacuum is turned off to that portion of the imaging drum, the end of the dye donor sheet material will tend to lift from the surface of the imaging drum. Thus turning off the vacuum eliminates the bending force on the dye donor sheet material, and is used as an advantage in the removal of the dye donor sheet material from the imaging drum As shown in FIGS. 6A through 6C, the thermal print media 32 when mounted on the drum 300 is seated within the radial recess 326. Therefore, the donor support rings 324 have a thickness which is substantially equal to the thickness of the thermal print media 32 seated therebetween. In this embodiment, this thickness is 0.004 inches. The purpose of the radial recess 326 on the drum 300 surface is to eliminate any creases in the dye donor sheet material 36, as the materials are drawn down over the thermal print media 32 during the loading of the dye donor sheet material 36. This ensures that no folds or creases will be generated in the dye donor sheet material 36, which could extend into the image area and seriously adversely affect the intended image. The radial recess 326 also substantially eliminates the entrapment of air along the edge of the thermal print media 32, the vacuum holes 306 in the drum 300 surface cannot always ensure the removal of the entrapped air. Any residual air between the thermal print media 32 and the dye donor sheet material 36 can also adversely affect the intended image.

External Scanner

Figure 7:
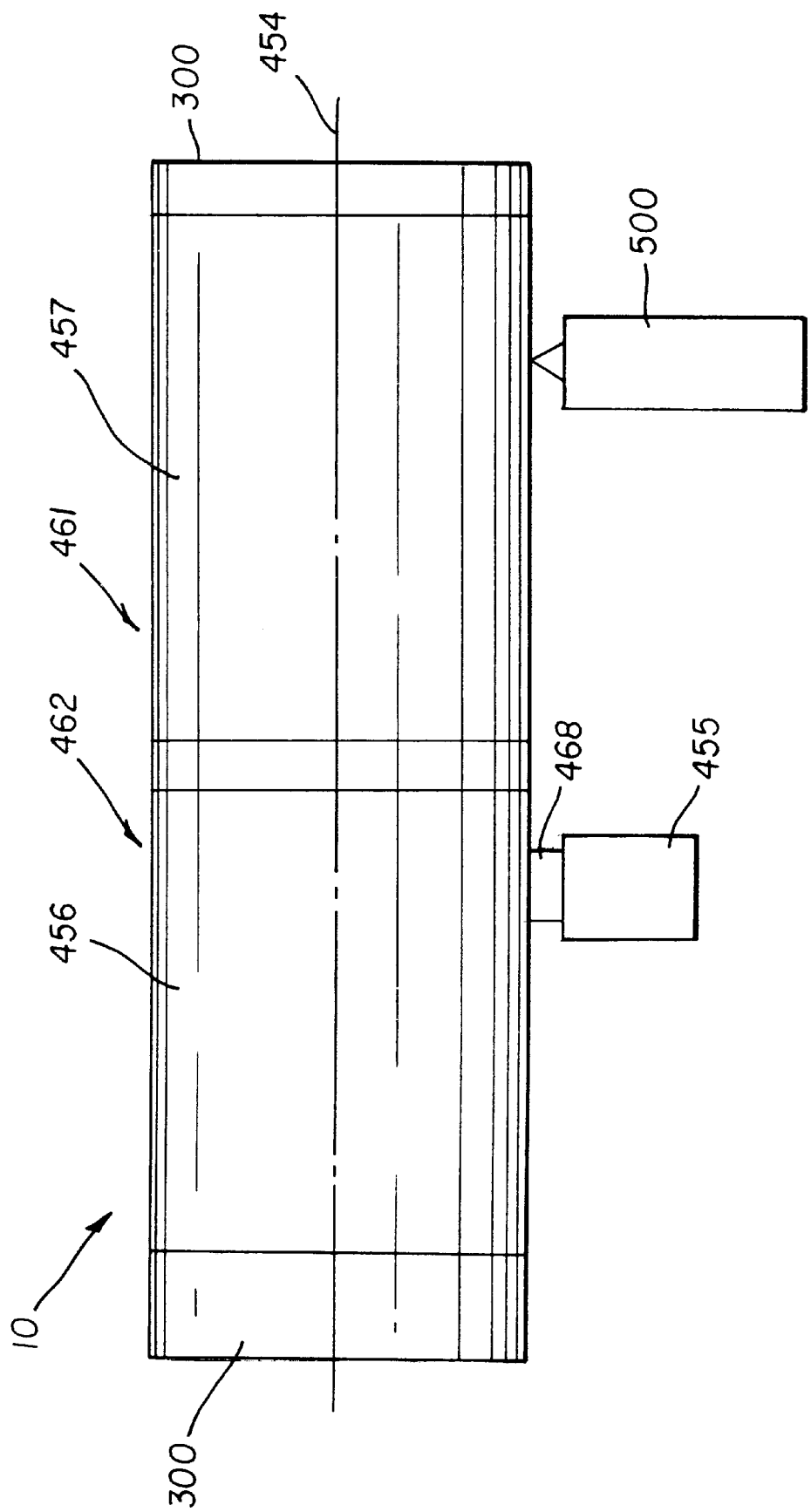
FIG. 7 is a top plan view of a drum, printhead, and external scanner according to the present invention.
Figure 8:
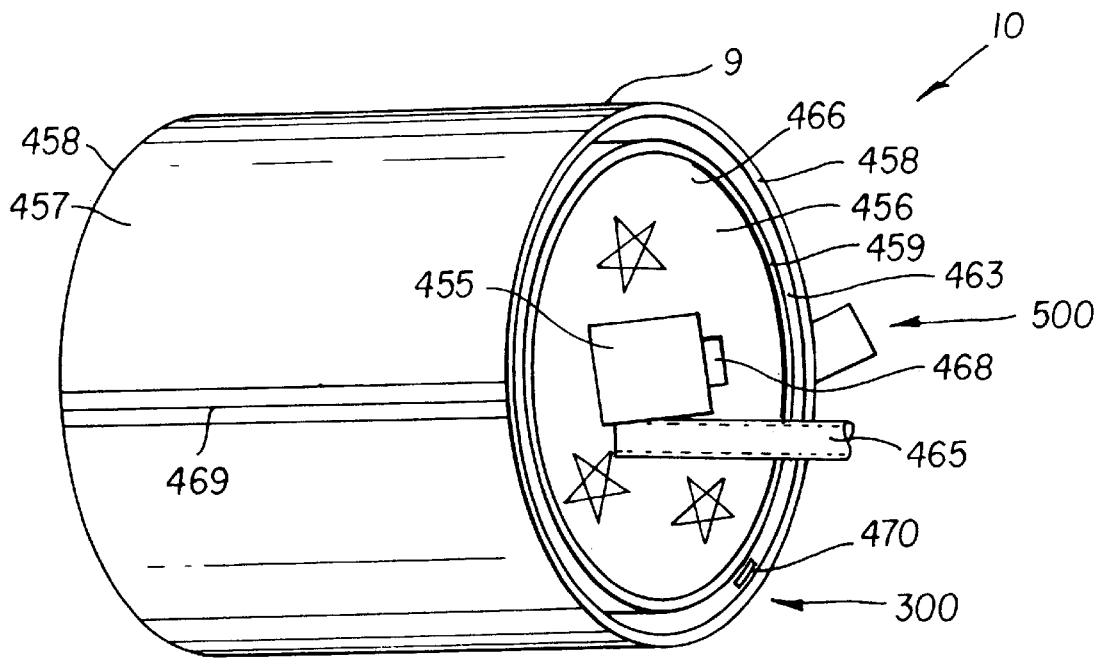
FIG. 8 is a perspective view of a drum and internal scanner according to the present invention.
Figure 9:
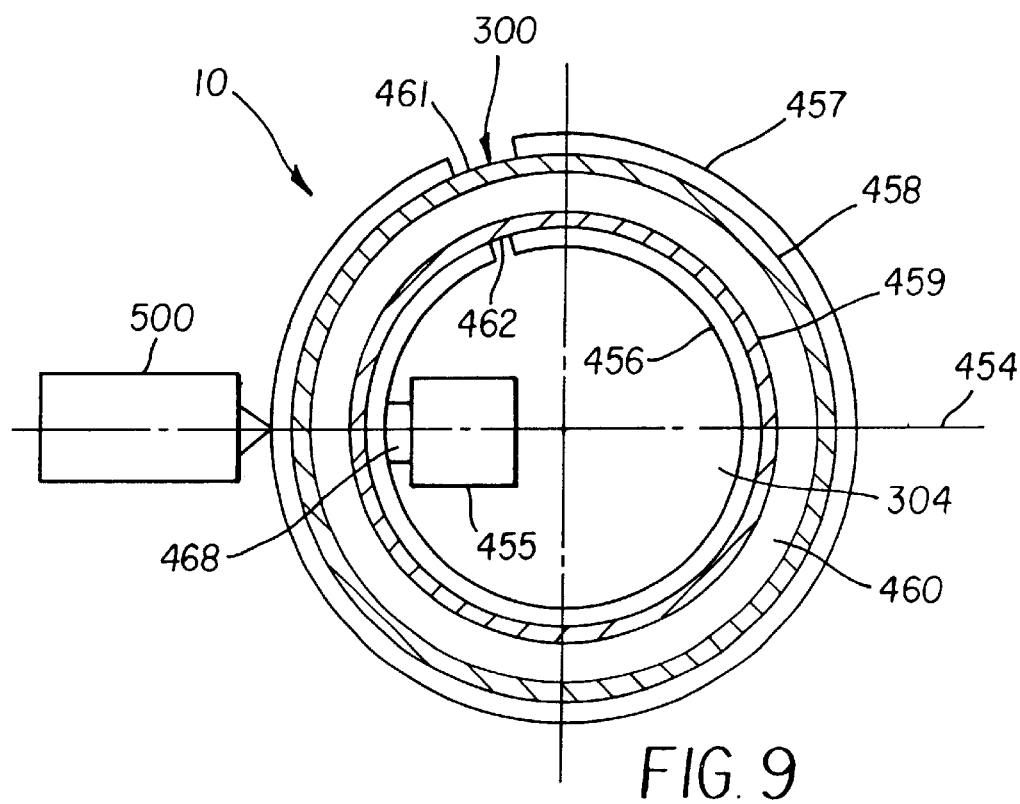
FIG. 9 is a cross-sectional view of a drum and internal scanner, taken along line 9—9 of FIG. 8.

In the present invention, the input scanner 455 is located either outside the drum, as shown in FIG. 7, or inside the drum, as shown in FIGS. 8 and 9. The scanner 455 is most preferably a drum scanner comprising a CCD array 468 in the scanner head for interpreting the input image, which is, for example, a painting, print, artist's sketch, film negative or positive. With the external scanner, the same drum 300, translator drive/translation stage, rods, drive, and associated machine electronics and controls electronics are preferably used to both scan and print, which conserves space and money. Preferably, the same lead screw is also used. Thus, the proofer and scanner share control electronics, including linear rotation (e.g., moving the lead screw, moving the printhead linearly along the drum), motion rotation, and media feeding mechanisms.

Referring to FIG. 7, a top plan view of a preferred embodiment of the apparatus 10 illustrates a drum 300, input scanner 455, and printhead 500. The input scanner 455 is mounted externally and adjacent to the drum One long drum 300 comprising a proofing, or imaging, portion 461 adjacent to a scanning portion 462 is shown in FIG. 7. In this embodiment, the cylindrical drum is approximately twice the length of a conventional vacuum imaging drum, but with the same diameter. The centerline 454 is as indicated in FIG. 7. The intended image is wrapped around the proofing, or imaging, portion 461, as described herein, and the input image is similarly wrapped around the scanning portion 462. The printhead 500 is shown adjacent to the intended image 457. The input scanner 455, which is shown next to the printhead, is illustrated in a position that is suitable for scanning the input image 456.

The images are held to the drum side by side by a vacuum within the drum, as described herein. Alternatively, the input image is removably mounted on the drum by the operator using clamps or adhesive tape.

In operation, the drum 300 rotates at a constant velocity while the printhead 500 moves axially along the longitudinal axis of the proofing/imaging portion 461 of the drum 300 for transferring the data to create the intended image 457 onto the thermal print media. Meanwhile, the input scanner 455 moves axially along the longitudinal axis of the scanning portion 462 of the drum while the CCD array 468 in the scanner head scans the input image 456.

As shown in FIG. 2, the printhead 500 and the scanner 455 are movably attached to the same lead screw 250. The printhead 500, scanner 455, and lead screw 250 are assembled in a frame as illustrated in FIG. 2. The printhead is mounted on a first translation stage member 220. Though it is mounted on the same lead screw, the scanner in FIG. 2 is shown on a separate, second translation stage member 222. As described hereinabove, the lead screw drive nuts 254 and drive coupling permit axial movement along the longitudinal axis of the drum 300 for transferring the data to create the intended image on the thermal print media 32, and for scanning the input image 456.

For the external scanner, the proofer and the scanner preferably are tied to and utilize the same lead screw 250 and translation stage 220. Since the drum 300 is longer, the translation stage is correspondingly longer. Alternatively, two separate translation stages 220, 222 may be employed, one 222 with a scanning head for taking input data, and one 220 with a laser thermal printhead for writing images. The two translation stages are tied to the same lead screw 250, with two separate nuts 254 tying each translation stage to the lead screw. The translation stages are driven by the same mechanism as described hereinabove. Alternatively, each translation stage could be tied to a separate lead screw 250 (first), 465 (second), though this is less preferred.

Alternatively, the apparatus 10 may include two identically sized, adjacent drums rather than one long drum. In that case, one drum is used for proofing or writing the image, and the other drum is for scanning. A figure showing a schematic diagram of this embodiment would be identical to FIG. 7, except for a separation in the middle of the drum, indicating two side by side drums. The scanner 455 and printhead 500 could be tied to the same lead screw 250 or two different lead screws 250, 456, and mounted on one translation stage 220 or two separate translation stages 220, 222.

The apparatus may alternatively include a flat bed scanner and proofer, which are preferably either side by side or on top of one another on different platens within the same apparatus. In its simple form, the image processing apparatus comprises: a) an output imager; b) an input scanner connected to the imager; and c) a mechanism for scanning and proofing the image at the same time. The imager and scanner are set to the same predetermined baseline settings as a starting point for image correction. The scanner and imager are preferably enclosed by the same apparatus housing.

Although both the scanner and proofer portions of the apparatus are intended for use at the same time, either portion of the embodiment of FIG. 7 may be utilized on its own. In other words, the operator may choose to use the apparatus as just a proofer or plate writer all or some of the time, or as just an image scanner. In the former case, the proofer/writer portion 461 is used, and in the latter case, the scanner portion 462 of the drum is employed.

Internal Scanner

Turning to FIGS. 8 and 9, a cross-sectional view and a perspective view from the open end 466 of the drum 300 surprisingly show the input scanner 455 within the hollowed-out interior 304 of the drum. When the input scanner 455 is located inside the hollow drum interior 304, the image to be captured, such as a painting, print, artist's sketch, film negative or positive, which is the input image 456, is transported to or otherwise placed in the interior of the drum. For the purposes of illustration, the three stars in FIG. 8 indicate a design on the input image inside the drum. The apparatus 10 writes the proof external to the drum, and scans the image internal to the drum Two working environments are created in the same space where one existed before. This makes for a more compact apparatus. The scanner and writer/proofer share one drum, one translation stage, one set of control electronics, one set of machine electronics, etc. Thus, the cost of manufacturing the apparatus is decreased, floor space is saved, and trouble shooting is facilitated.

The reverse is also included herein. In that more technically difficult case, the printhead is internal and the scanner is external to the drum The proof is written inside the drum, while the image is scanned outside the same drum. In this embodiment, the input image is taped, clipped, or vacuum adhered to the outside surface of the drum, and the thermal print media is similarly adhered to the inside surface of the drum The above-mentioned benefits are also seen for this apparatus.

As shown in FIGS. 8 and 9, the hollow drum 300 is comprised of a cylindrical outer drum wall 458, and a cylindrical inner drum wall 459, which is parallel to it. The optical centerline 454 is as indicated in FIG. 9. The outer drum wall 458 encloses the inner drum wall 459. Between the two parallel drum walls is a vacuum chamber 460, as shown in FIGS. 8 and 9. When the image processing apparatus is in operation, a vacuum is applied in the vacuum chamber 460 between the two drum walls 458, 459. Preferably, vacuum is applied from the hollow vacuum chamber 460 through vacuum grooves and/or holes 306 in both the inner and outer drum walls. The vacuum grips the input image 456 against the inner drum wall 459 via the vacuum holes in the inner drum wall. Outside the drum, a vacuum exerted through the vacuum holes 306 in the outer drum wall likewise maintains the intended image 457 in position against the outer drum wall 458. The intended image and the input image are held in place without damage to the images until the vacuum is turned off In an alternate embodiment, there are no vacuum holes in the inner drum wall. Instead, although the intended image is held against the outside of the drum by a vacuum, the input image is held against the inner drum wall by the centrifugal force generated by the spinning drum (see FIG. 1).

In use, the operator inserts the input image into the hollowed-out interior of the drum by means of a slot 464 in the drum, or by rolling the input image and inserting it into an open end 466 of the drum The closable drum slot 464 extends through the inner and outer walls. The drum can be accessed through a door (not shown) in the housing. The operator attaches the edges of the image to the inside edges of the drum by means of clamps or adhesive tape. Instead of an end plate 308 provided with a centrally disposed vacuum spindle 318, one end 466 of the drum may be left open, as shown in FIG. 8, to accommodate the input image. In that case, the drum is only supported at its opposite end, and the end of the vacuum chamber at the open end is walled 463, as shown in FIG. 8. Alternatively, the drum end may have a door which the operator can open to insert the input image.

As the rotating drum revolves at its controlled speed, the scanner scans the input image as it revolves within the drum interior. The scanning head of the input scanner 455 is positioned inside the hollow interior portion 304 of the drum 300 so that it scans the input image 456. The scanning head travels in a path along the drum, while being moved at a speed synchronous with the drum rotation. The scanner then separates the original digital image into three or more subtractive primaries in black. The scanner separates the colors and creates a half tone digital file (bitmap). Rotation of the drum is not impaired by the presence or operation of the scanner. Operation of the proofer is also not interfered with by operation of the scanner.

Where the scanning head is inside the drum, or where the scanner is external and the printhead is inside the drum, the scanner and proofer are tied to separate lead screws by two separate nuts. Preferably, one translation stage holds the scanning head for taking input data, and a second translation stage holds the laser thermal printhead for writing images. The translation stages are driven by the same mechanism as described hereinabove. The scanner 455 is shown tied to its lead screw 465 in FIG. 8. The scanner preferably moves back and forth, too, as the drum rotates. The scanner head is less preferably the width of the drum. The scanner and printhead are preferably connected to and utilize the same drive mechanism.

Where a greater degree of automation is desired, the input image can alternatively be transported to the interior or exterior of the drum by means of a transport mechanism rather than being placed in or on the drum by the operator. The transport mechanism is preferably similar to the above-described material input and exit transport systems for the thermal print media. In this embodiment, the alternate material tray 50b positioned in an interior portion of the image processor housing 12 as shown in FIG. 1 is an input image material tray. The operator places the input image 456 in the input image material tray 50b and depresses the appropriate "input image" control button or icon. The apparatus is configured to transport the input image from the material tray 50b to the exterior surface or interior wall of the drum, depending on the scanner location.

The dye donor sheet material 36 is removed from the drum 300 and exits the image processor housing 12 via a skive or ejection chute 16 after the printhead 500 completes the transfer process for the particular dye donor sheet material 36 resting on the thermal print media 32. The dye donor sheet material 36 eventually comes to rest in a waste bin 18 for removal by the user. The input image, on the other hand, exits the apparatus 10 via the transport mechanism As shown in FIG. 1, the input image ends up resting on an exit tray 22, on the opposite side of the apparatus, where it awaits removal by the operator.

In the alternate embodiment, the input image is removed by the operator. In this embodiment, the operator untapes or unclips the input image and slides it out of the same open end of the drum Optionally, a blower can be set at the supported end of the drum to blow the input image out of the open end of the drum at the completion of the process. The operator would then receive the image from the open end of the drum.

Referring to FIG. 8, the apparatus preferably includes a light source 470 for illuminating the input image. The light source 470 is preferably positioned either within the input scanner 455 or within the vacuum chamber 460 in the vacuum imaging drum, or both. When the light source 470 is in the vacuum chamber, it shines through the vacuum holes in the inner drum wall and through the input image from the rear of the image. This is useful, for example, where the image is a film negative. Where the input image is a painting or the like, reflectance from inside the scanner head is preferred over back lighting. The apparatus 10 controls include buttons or icons which the user depresses to select the appropriate pre-programmed lighting.

In summary, then, a preferred embodiment of the image processing apparatus with an internal scanner includes a rotatable drum, which is comprised of an outer, cylindrical drum wall enclosing an inner, cylindrical drum wall. The embodiment further includes a vacuum chamber between the outer drum wall and the inner drum wall, means for providing a vacuum to the vacuum chamber, and a plurality of openings through the outer drum wall for communicating the vacuum from the vacuum chamber to the exterior surface of the drum. Particularly where the input image is a film negative or positive, the embodiment includes a plurality of openings through the inner drum wall for communicating the vacuum from the vacuum chamber to the interior surface of the drum Particularly where the input image is a film negative or positive, the drum comprises a sealable slot along its length for admitting the input image into the hollowed out interior of the drum. A light source within the vacuum chamber is particularly preferred where the input image is a film negative. Where an automated system is desired, the apparatus includes an automated transport mechanism for transporting the input image to the drum, and the transport mechanism includes a sheet material tray in a housing of the apparatus.

Where the input image is a painting, print, or artist's sketch, the scanner comprises a light source for reflectance. Where the input image is a painting, print, or artist's sketch, the inner wall of the drum comprises clips along its edge for removably mounting the input image on the inner wall.

Also included herein is the reverse case, where the apparatus includes:

a) a rotatable drum comprising a hollowed out interior portion, and an imaging portion on its interior surface, and a scanning portion on its exterior surface, the drum being mounted for rotation about an axis, the imaging portion of the drum being arranged to mount a receiver sheet and a donor sheet in superposed relationship thereon, the scanning portion of the drum being arranged to mount an input image thereon;

b) a motor for rotating the drum;

c) a printhead inside the hollowed-out interior portion of the drum, d) an input scanner outside the drum, e) a first lead screw for moving the printhead in a first direction, the printhead being mounted on the first lead screw, and a second lead screw for moving the scanner in a first direction, the scanner being mounted on the second lead screw; and f) a linear translation subsystem or subsystems on which the printhead, scanner, drum, and lead screws are mounted. Again, preferably the receiver sheet is thermal print media, the donor sheet is dye donor sheet material, and the input image is a painting, print, artist's sketch, or a film negative or positive.

Process

Figure 10:
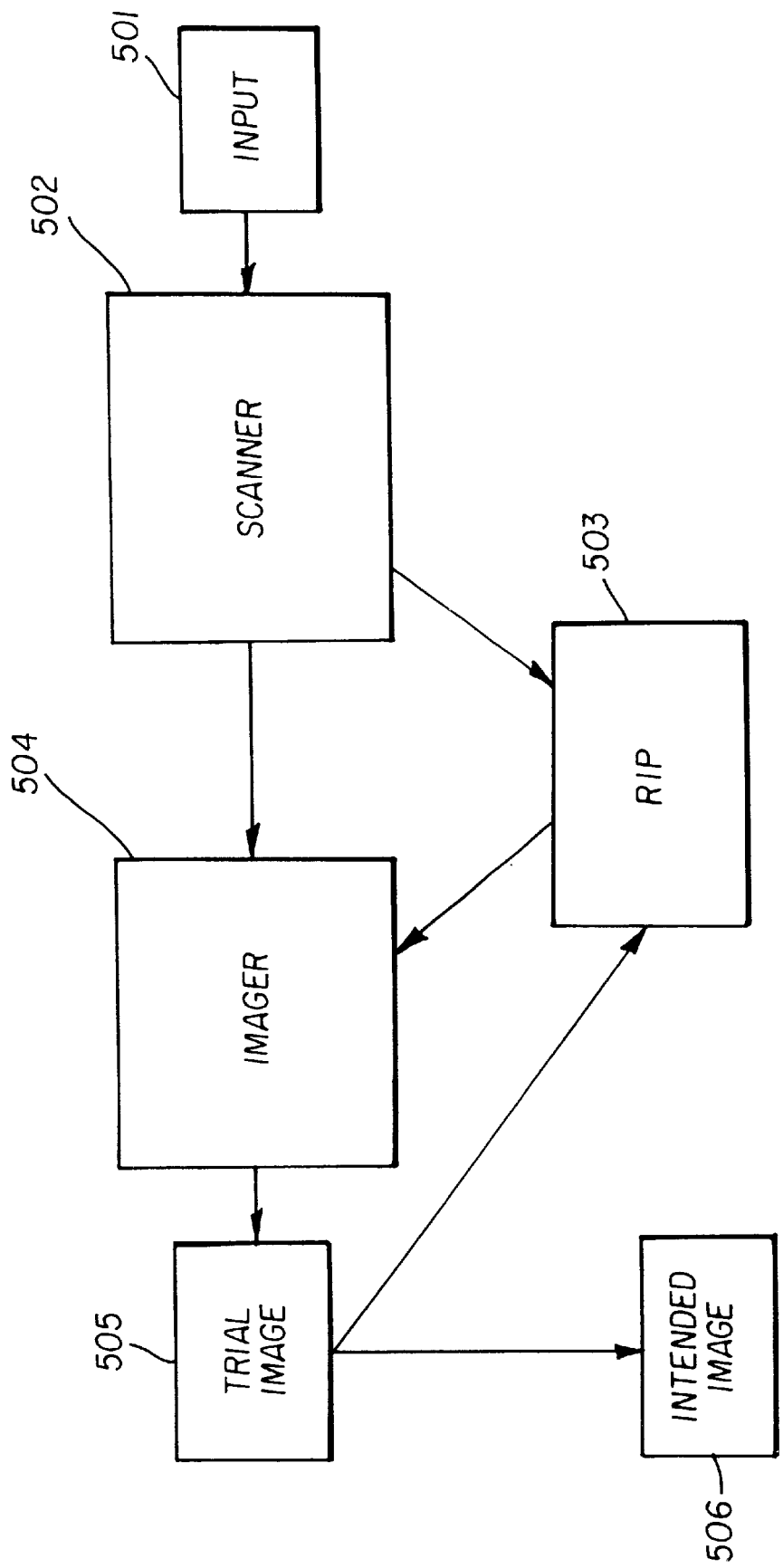
FIG. 10 is a diagrammatic representation of a color imaging process according to the present invention.

Referring to FIG. 10, a preferred image production process according to the present invention includes the following steps:

a) introducing an input image, as shown in Block 501, to a scanner, as shown in Block 502, within an image processing apparatus comprising the scanner, an imager, and memory;

b) contemporaneously forwarding the image data from the scanner to the imager, as shown in Blocks 503 and 504, and to memory; and c) outputting a trial image, as shown in Block 505, from the imager (Block 504).

The process preferably further includes the steps of d) inputting corrective data to the imager (Block 503); and e) outputting an intended image from the corrected data, as shown in Block 506.

The steps of the process are preferably undertaken within a single image producing apparatus comprising the scanner, the imager, and a printer. The operator picks up the print-out, reviews it, and remedies defects prior to final output.

The present invention also includes a color image production process for scanning and writing images to a thermal print media at the same time, comprising the steps of a) inputting an intended image to an image processing apparatus, the image processing apparatus comprising a rotatable drum, a translation system, and an input scanner and a printhead mounted on the translation system adjacent to the drum;

b) attaching an input image to an input scanner portion of the drum;

c) loading thermal print media and dye donor material onto an imaging portion of the drum;

d) spinning the drum;

e) translating the input scanner and the printhead along the drum using the translation system, which is in coordinated motion to the spinning drum;

f) ripping and feeding data from the scanner portion of the drum to the printhead; and g) creating a trial image on the thermal print media.

The process preferably also includes the steps of:

h) modifying and re-ripping the image as required; and i) creating the intended image on the thermal print media. The method preferably further includes the step of printing the scanned image as a half tone image prior to working with the image on a workstation, and at the same time that the image is being created on the thermal print media.

Figure 11:
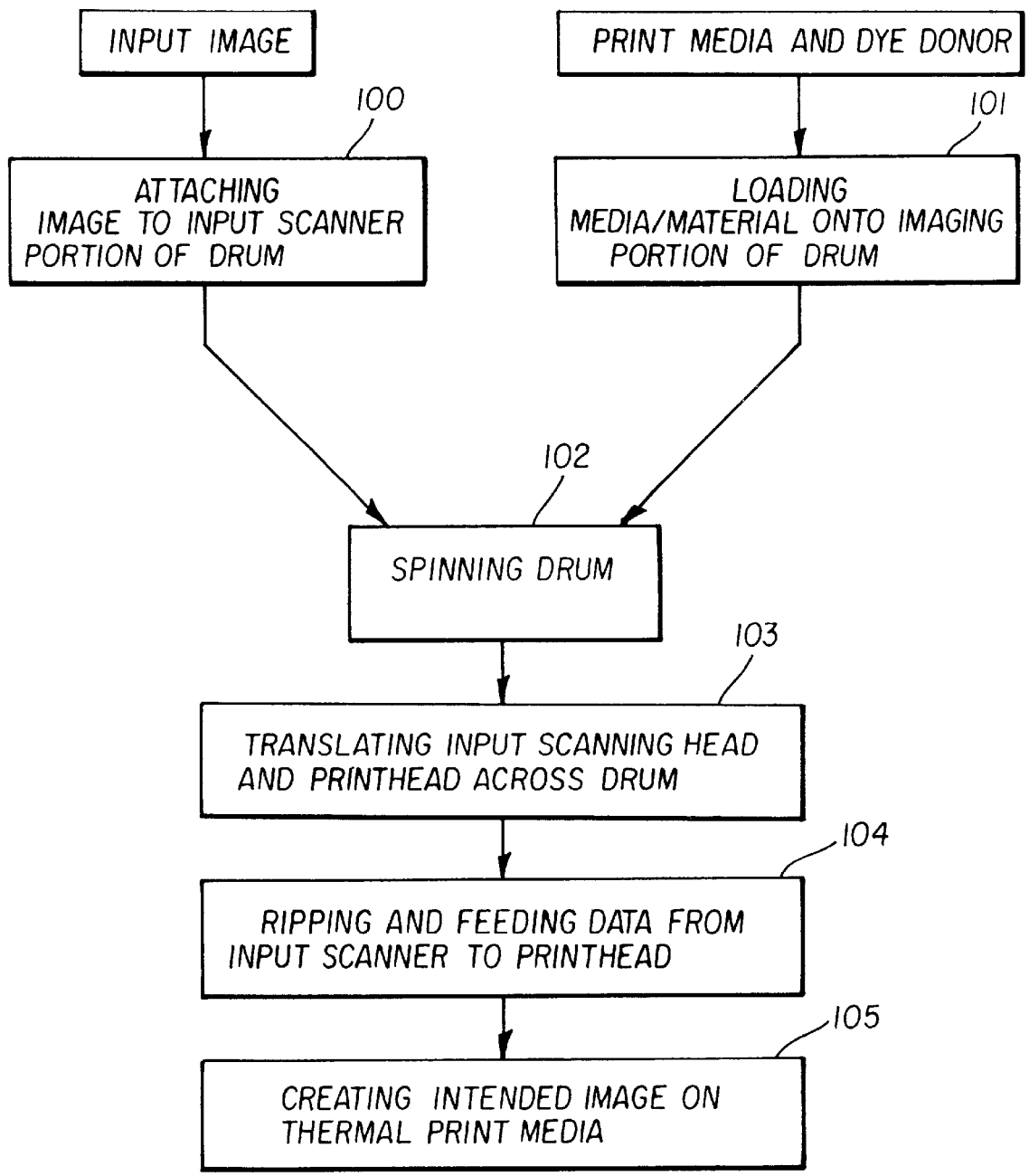
FIG. 11 is a flowchart of a color image proofing process according to the present invention.

As illustrated in FIG. 11, a preferred process herein comprises the steps of 1) attaching an input image to a scanner portion of a drum, as indicated in Block 100;

2) loading print media and dye donor material onto an imaging portion of the same drum, as indicated in Block 101;

3) spinning the drum at a controlled speed sufficient to produce the intended image, as indicated in Block 102;

4) translating the scanning head of an input scanner across the scanning portion of the drum, and a printhead across the imaging portion of the drum, as indicated in Block 103;

5) ripping and feeding data from the input scanner to the printhead, as indicated in Block 104; and 6) creating intended image on the print media, as indicated in Block 105.

Simply put, this image producing process for scanning and writing images to a thermal print media includes the step of printing the image on a printer as the image is being scanned on a scanner, the scanner, printer, and output imager being within a single image processing apparatus.

In short, the process includes the steps of scanning an image, separating the original digital image into subtractive primaries, creating a half tone digital file, and printing the image as it is being scanned. The scanner takes the original image, separates the colors, and creates a bitmap. The image is scanned and written at the same time. Once the operator is finished screening it, and the paper comes out of the proofing apparatus, the operator can touch it up. Once the image is scanned, the operator has a hard copy image from the digital imager.

The present invention can be used in other applications, such as writing to imagesetter film or writing to IR thermal plates. The present invention is applicable to any type of drum. Also, the dye donor may have dye, pigments, or other material, which are transferred to the thermal print media. The term "thermal print media" is meant to include paper, films, plates, and other material capable of accepting or producing an image. Ink jet printers are included herein along with laser thermal printers. The die may be colorant, ink, or the like.

The invention has been described in detail with particular reference to certain preferred embodiments thereof, but it will be understood that variations and modifications can be effected within the scope of the invention. While preferred embodiments of the invention have been described using specific terms, this description is for illustrative purposes only. It is intended that the doctrine of equivalents be relied upon to determine the fair scope of these claims in connection with any other person's product which fall outside the literal wording of these claims, but which in reality do not materially depart from this invention.

Parts List

10. Image processing apparatus
12. Image processor housing
14. Image processor door
16. Donor ejection chute
18. Donor waste bin
20. Media stop
22. Exit tray
30. Roll media
32. Thermal print media
34. Dye donor roll material
36. Dye donor sheet material
38. Low cost support roll material
50. Sheet material trays
50a. Lower sheet thermal print material tray
50b. Upper sheet input image material tray
52. Media lift cams
52a. Lower media lift cam
52b. Upper media lift cam
54. Media rollers
54a. Lower media roller
54b. Upper media roller
56. Media guide
58. Media guide rollers
60. Media staging tray
80. Transport mechanism
98. Master lathe bed scanning engine
100. Media carousel
110. Media drive mechanism
112. Media drive rollers
120. Media knife assembly
122. Media knife blades
198. Master lathe bed scanning engine
200. Lathe bed scanning subsystem
202. Lathe bed scanning frame
204. Entrance passageway
206. Rear translation bearing rod
208. Front translation bearing rod
210. Translation system
220. Translation stage member (first)
222. Second translation stage member
250. Lead screw (first)
252. Threaded shaft
254. Lead screw drive nut
258. Translator drive linear motor
260. Axial load magnets
260a. Axial load magnet
260b Axial load magnet
262. Circular-shaped boss
264. Ball bearing
266. Circular-shaped insert
268. End cap
270. Hollowed-out center portion
272. Radial bearing
300. Imaging drum
301. Axis of rotation
302. Drum housing
304. Hollowed-out interior portion
306. Vacuum hole
308. Vacuum end plate
310. Drive end plate
312. Drive spindle
318. Vacuum spindle
320. Central vacuum opening
322. Axially extending flat
324. Donor support ring
326. Radial recess
332. Vacuum grooves
346. First radial recess
348. Second radial recess
350. Load roller
400. Laser assembly
402. Laser diodes
404. Fiber optic cables
406. Distribution block
454. Optical centerline
455. Scanner
456. Input image
457. Intended image
458. Outer drum wall
459. Inner drum wall
460. Vacuum chamber
461. Imaging/proofing portion of drum
462. Scanning portion of drum
463. End wall of vacuum chamber
464. Drum slot
465. Second (scanner) lead screw
466. Open end of drum
468. CCD array in scanner head
470. Light source
500. Printhead

What is claimed is:

1. An image processing apparatus for scanning and proofing an image at the same time, the apparatus comprising:
  a) a rotatable drum comprising an imaging portion on its exterior surface, and a scanning portion on its interior surface, the imaging portion of the drum being arranged to mount a receiver sheet and a donor sheet in superposed relationship thereon, the scanning portion of the drum being arranged to mount an input image thereon, the drum being mounted for rotation about an axis, and the drum further comprising a hollowed-out interior portion;
  b) a motor for rotating the drum;
  c) a printhead external to the drum;
  d) an input scanner inside the hollowed-out interior portion of the drum;
  e) a first lead screw for moving the printhead in a first direction, the printhead being mounted on the first lead screw, and a second lead screw for moving the scanner in a first direction, the scanner being mounted on the second lead screw; and
  f) a linear translation subsystem or subsystems on which the printhead, scanner, drum, and lead screws are mounted.

2. An image processing apparatus according to claim 1, further comprising a single set of control electronics for controlling both the scanning portion and imaging portion of the apparatus.

3. An image processing apparatus according to claim 1, wherein the drum is comprised of an outer, cylindrical drum wall, enclosing an inner, cylindrical drum wall.

4. An image processing apparatus according to claim 3, wherein the receiver sheet is thermal print media, and the donor sheet is dye donor sheet material.

5. An image processing apparatus according to claim 4, further comprising a vacuum chamber between the outer drum wall and the inner drum wall.

6. An image processing apparatus according to claim 5, further comprising means for providing a vacuum to the vacuum chamber, and a plurality of openings through the outer drum wall for communicating the vacuum from the vacuum chamber to the exterior surface of the drum.

7. An image processing apparatus according to claim 5, further comprising means for providing a vacuum to the vacuum chamber, and a plurality of openings through the inner drum wall for communicating the vacuum from the vacuum chamber to the interior surface of the drum.

8. An image processing apparatus according to claim 7, wherein the input image is a film negative or positive.

9. An image processing apparatus according to claim 7, wherein the drum comprises a sealable slot along its length for admitting the input image into the hollowed out interior of the drum.

10. An image processing apparatus according to claim 7, further comprising an automated transport mechanism for transporting the input image to the drum, the transport mechanism comprising a sheet material tray in a housing of the apparatus.

11. An image processing apparatus according to claim 10, wherein the scanner and printhead are connected to and utilize the same drive mechanism.

12. An image processing apparatus according to claim 4, wherein the input image is a painting, print, or artist's sketch, and the scanner comprises a plurality of light sources.

13. An image processing apparatus according to claim 12, wherein the inner wall of the drum comprises clips along its edge for removably mounting the input image on the inner wall.

14. An image processing apparatus according to claim 1, further comprising a light source within the vacuum chamber.

15. An image processing apparatus for scanning and proofing an image at the same time, the apparatus comprising:

a) a rotatable drum comprising a hollowed out interior portion, and an imaging portion on its interior surface, and a scanning portion on its exterior surface, the drum being mounted for rotation about an axis, the imaging portion of the drum being arranged to mount a receiver sheet and a donor sheet in superposed relationship thereon, the scanning portion of the drum being arranged to mount an input image thereon;

b) a motor for rotating the drum;

c) a printhead inside the hollowed-out interior portion of the drum;

d) an input scanner outside the drum;

e) a first lead screw for moving the printhead in a first direction, the printhead being mounted on the first lead screw, and a second lead screw for moving the scanner in a first direction, the scanner being mounted on the second lead screw; and f) a linear translation subsystem or subsystems on which the printhead, scanner, drum, and lead screws are mounted.

16. An image processing apparatus according to claim 15, further comprising a single set of control electronics for controlling both the scanning portion and imaging portion of the apparatus.

17. An image processing apparatus according to claim 15, wherein the drum is comprised of an outer, cylindrical drum wall, enclosing an inner, cylindrical drum wall.

18. An image processing apparatus according to claim 15, further comprising a vacuum chamber between the outer drum wall and the inner drumwall.

19. An image processing apparatus according to claim 18, further comprising means for providing a vacuum to the vacuum chamber, and a plurality of openings through the outer drum wall for communicating the vacuum from the vacuum chamber to the exterior surface of the drum.

20. An image processing apparatus according to claim 15, further comprising a light source within the vacuum chamber.

21. An image processing apparatus according to claim 15, further comprising means for providing a vacuum to the vacuum chamber, and a plurality of openings through the inner drum wall for communicating the vacuum from the vacuum chamber to the interior surface of the drum.

* * * * *